(12) United States Patent
Aoki

(10) Patent No.: US 8,395,443 B2
(45) Date of Patent: Mar. 12, 2013

(54) DOHERTY AMPLIFIER

(75) Inventor: Nobuhisa Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/359,189

(22) Filed: Jan. 26, 2012

(65) Prior Publication Data

US 2012/0235749 A1    Sep. 20, 2012

(30) Foreign Application Priority Data

Mar. 18, 2011    (JP) .................................. 2011-061756

(51) Int. Cl.
*H03F 3/68*    (2006.01)
(52) U.S. Cl. .................................... 330/124 R; 330/295
(58) Field of Classification Search .............. 330/124 R, 330/295
See application file for complete search history.

(56) References Cited

U.S. PATENT DOCUMENTS

| | | | |
|---|---|---|---|
| 6,472,934 B1 * | 10/2002 | Pehlke | 330/10 |
| 6,940,349 B2 * | 9/2005 | Hellberg | 330/124 R |
| 7,295,065 B2 * | 11/2007 | Shah et al. | 330/124 R |
| 7,391,259 B2 * | 6/2008 | Parker et al. | 330/84 |
| 7,714,648 B2 | 5/2010 | Okubo et al. | |
| 7,847,630 B2 * | 12/2010 | Okubo et al. | 330/124 R |

FOREIGN PATENT DOCUMENTS

| | | |
|---|---|---|
| JP | 2005-322993 A | 11/2005 |
| JP | 2006-166141 A | 6/2006 |
| JP | 2007-006450 A | 1/2007 |
| JP | 2007-081800 A | 3/2007 |

* cited by examiner

*Primary Examiner* — Patricia Nguyen
(74) *Attorney, Agent, or Firm* — Fujitsu Patent Center

(57) ABSTRACT

A Doherty amplifier includes a first amplifier, a second amplifier, a transmission line, a synthesizer, and an output load. The first amplifier amplifies an RF input signal according to a voltage applied to a supply terminal thereof. The second amplifier amplifies a peak component of the RF input signal according to a voltage applied to a supply terminal thereof. The transmission line is coupled to an output terminal of the first amplifier. The synthesizer is coupled to an output terminal of the transmission line and an output terminal of the second amplifier. It is set such that the voltage applied to the supply terminal of the first amplifier is lower than the voltage applied to the supply terminal of the second amplifier, and that an impedance value of the transmission line is smaller than a value twice an impedance value of the output load.

3 Claims, 2 Drawing Sheets

US 8,395,443 B2

DOHERTY AMPLIFIER

CROSS-REFERENCE TO RELATED APPLICATION

This application is based upon and claims the benefit of priority of the prior Japanese Patent Application No. 2011-061756, filed on Mar. 18, 2011, the entire contents of which are incorporated herein by reference.

FIELD

The embodiments discussed herein are directed to a Doherty amplifier.

BACKGROUND

In recent years, a linear modulation method such as orthogonal frequency division multiplexing (OFDM) has been widely used as a modulation method for improving frequency use efficiency. Signals modulated by the linear modulation method such as OFDM tend to have a high peak to average power ratio (PAPR). Therefore, recently, various amplifiers that amplify a signal having a high PAPR with a high efficiency have been examined. For example, a Doherty amplifier has been known as such an amplifier.

FIG. 3 is a configuration example of a general Doherty amplifier. As depicted in FIG. 3, the Doherty amplifier includes a distributor 11, a carrier amplifier 12, a phase regulator 13, a peak amplifier 14, an impedance converter 15, a synthesizer 16, and an output load 17.

The distributor 11 branches a radio frequency (RF) signal input from an input terminal 11a into two RF signals, and distributes one of the RF signals to the carrier amplifier 12, and the other RF signal to the phase regulator 13. The carrier amplifier 12 amplifies the RF signal input from the distributor 11 according to a voltage applied to a supply terminal 12a, and outputs the amplified RF signal to the impedance converter 15.

The phase regulator 13 regulates the phase of the RF signal input from the distributor 11, and outputs the phase-regulated RF signal to the peak amplifier 14. The peak amplifier 14 amplifies a peak component of the RF signal input from the distributor 11 according to a voltage applied to a supply terminal 14a, and outputs the amplified RF signal to the synthesizer 16. The impedance converter 15 is a transmission line having an electrical length of λ/4, and is connected to an output terminal of the carrier amplifier 12. The synthesizer 16 is connected to an output terminal of the impedance converter 15 and an output terminal of the peak amplifier 14, and synthesizes the RF signal from the impedance converter 15 and the RF signal from the peak amplifier 14. The output load 17 is connected to an output terminal of the synthesizer 16. An impedance value $Z_0$ of the output load 17 is fixed.

In the Doherty amplifier depicted in FIG. 3, it is set such that a voltage Vdd applied to the supply terminal 12a of the carrier amplifier 12 becomes the same as another voltage Vdd applied to the supply terminal 14a of the peak amplifier 14. Furthermore, in the Doherty amplifier, the carrier amplifier 12 operates in the Class AB or Class B, and the peak amplifier 14 operates in the Class B or Class C. That is, only the carrier amplifier 12 operates as a main amplifier until the carrier amplifier 12 becomes saturated, and when the carrier amplifier 12 becomes saturated, the peak amplifier 14 operates as a sub-amplifier.

The efficiency of the Doherty amplifier with respect to an output power varies according to a ratio $\alpha$ between a current $I_3$ output from the impedance converter 15 to the synthesizer 16 and a current $I_0$ output from the synthesizer 16 to the output load 17, when the respective amplifiers operate in the saturated state. Particularly, it is known that the efficiency of the Doherty amplifier becomes favorable when $\alpha<0.5$.

Therefore, as a conventional technique to realize the ratio of $\alpha<0.5$, there has been proposed a method of setting a device size of a carrier amplifier different from a device size of a peak amplifier. According to this conventional technique, for example, by setting an emitter area of the carrier amplifier to be smaller than that of the peak amplifier, the device sizes of the carrier amplifier and of the peak amplifier are set different from each other. The related techniques are disclosed in Japanese Laid-open Patent Publication No. 2007-081800, Japanese Laid-open Patent Publication No. 2007-006450, Japanese Laid-open Patent Publication No. 2005-322993, Japanese Laid-open Patent Publication No. 2006-166141, for example.

However, in the conventional technique for setting the device size of the carrier amplifier different from that of the peak amplifier, the impedance of the impedance converter is increased, and its efficiency is degraded as a result.

SUMMARY

According to an aspect of an embodiment of the invention, a Doherty amplifier includes a first amplifier that amplifies an RF input signal according to a voltage applied to a supply terminal thereof; a second amplifier that amplifies a peak component of the RF input signal according to a voltage applied to a supply terminal thereof; a transmission line coupled to an output terminal of the first amplifier; a synthesizer that is coupled to an output terminal of the transmission line and an output terminal of the second amplifier, and synthesizes an output signal of the transmission line and an output signal of the second amplifier; and an output load coupled to an output terminal of the synthesizer. And it is set such that the voltage applied to the supply terminal of the first amplifier is lower than the voltage applied to the supply terminal of the second amplifier, and that an impedance value of the transmission line is smaller than a value twice an impedance value of the output load.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of the present invention will be explained with reference to accompanying drawing.

Figure 1:
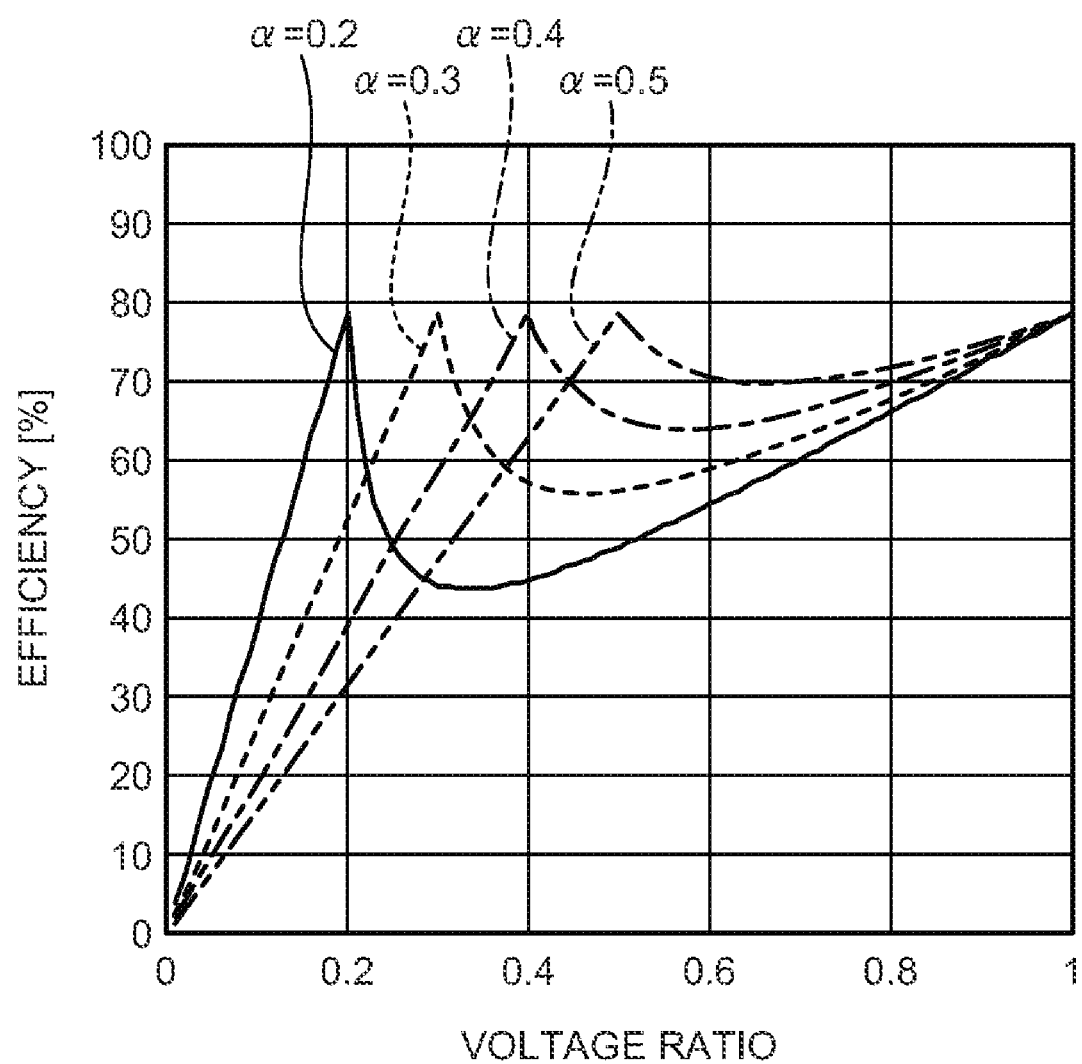
FIG. 1 depicts efficiency characteristics of a general Doherty amplifier.

Before explaining preferred embodiments of a Doherty amplifier according to the present invention, problems of a general Doherty amplifier are explained. FIG. 1 depicts efficiency characteristics of the general Doherty amplifier depicted in FIG. 3. In FIG. 1, a voltage ratio between the maximum voltage that can be output by the Doherty amplifier and an output voltage of the output load 17 is plotted on the horizontal axis and efficiency (%) is plotted on the vertical axis. In other words, the horizontal axis represents an output power and the vertical axis represents the efficiency (%). FIG. 1 also depicts efficiency characteristics at the time of changing the ratio α between the current $I_3$ output from the impedance converter 15 to the synthesizer 16 and the current $I_0$ output from the synthesizer 16 to the output load 17, when the Doherty amplifier outputs the maximum power.

As depicted in FIG. 1, when α is 0.5, the voltage ratio at which the efficiency takes a local maximum value is 0.5, and as the ratio α decreases than 0.5, the voltage ratio at which the efficiency takes a local maximum value decreases. This means that, as the ratio α decreases from 0.5, the efficiency of amplification with respect to a signal having a relatively high PAPR is improved. For example, it is assumed that a voltage ratio of the signal having a relatively high PAPR is 0.2. In this case, when the ratio α is 0.5, the efficiency when a modulation wave outputs an average power is about 30%. However, when the ratio α is 0.2, the efficiency is improved up to about 79%, which is the local maximum value. In this manner, the efficiency of the Doherty amplifier becomes favorable when the ratio α is smaller than 0.5.

Figure 3:
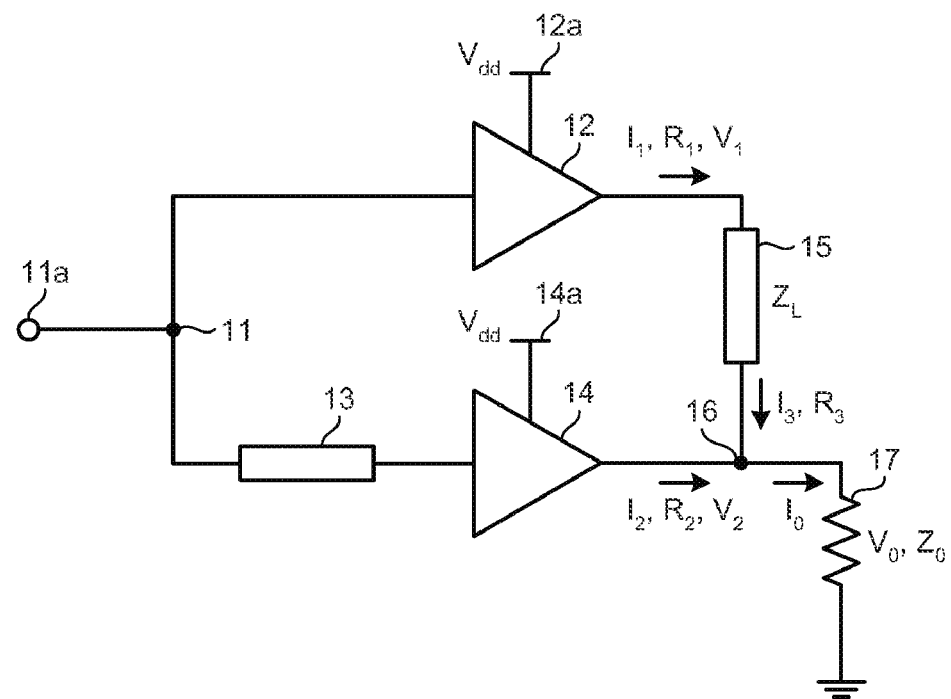
FIG. 3 is a configuration example of a general Doherty amplifier.

To realize such a state that the ratio α is smaller than 0.5, it is assumed that the device size of the carrier amplifier 12 is set different from that of the peak amplifier 14 in the conventional Doherty amplifier depicted in FIG. 3. For example, it is assumed that an emitter area of the carrier amplifier 12 is set to be smaller than that of the peak amplifier 14. In this case, an impedance $Z_L$ of the impedance converter 15 increases. The increase of the impedance $Z_L$ of the impedance converter 15 is explained below.

A state in which a peak amplifier and a carrier amplifier become saturated is considered here. First, the ratio α is defined by the following equation (1).

$$\alpha = I_3/I_0 \qquad (1)$$

where $I_3$ is a current output from the impedance converter 15 to the synthesizer 16, and $I_0$ is a current output from the synthesizer 16 to the output load 17.

In the output load 17, the following equation (2) is established.

$$V_0 = I_0 \cdot Z_0 \qquad (2)$$

where $V_0$ is a voltage of the output load 17, and $Z_0$ is an impedance value of the output load 17.

The following equation (3) is obtained from the equation (1) and the equation (2).

$$I_3 = \alpha \cdot V_0/Z_0 \qquad (3)$$

When the power at an input terminal and the power at an output terminal of the impedance converter 15 are the same and the impedance converter 15 becomes saturated, it is assumed that the output voltage of the peak amplifier and the output voltage of the carrier amplifier are the same. Therefore, $V_1 = V_2$ is established, and the following equation (4) is established.

$$V_1^2/R_1 = V_2^2/R_1 = I_3^2 \cdot R_3 \qquad (4)$$

where $V_1$ is a voltage at an output terminal of the carrier amplifier 12, $V_2$ is a voltage at an output terminal of the peak amplifier 14, $R_1$ is an impedance at the output terminal of the carrier amplifier 12, and $R_3$ is an impedance at an output terminal of the impedance converter 15.

The following equation (5) is obtained from the characteristics of the impedance converter 15.

$$R_1 \cdot R_3 = Z_L^2 \qquad (5)$$

The following equation (6) is obtained from the equation (4) and the equation (5).

$$Z_L = V_2/I_3 \qquad (6)$$

The following equation (7) is obtained from the equation (3), the equation (6), and a relation of $V_0 = V_2$.

$$Z_L = 1/\alpha \cdot Z_0 \qquad (7)$$

According to the equation (7), when the ratio α is smaller than 0.5, $Z_L > 2 \cdot Z_0$ is established. That is, in the conventional Doherty amplifier, when the ratio α is smaller than 0.5, the impedance value $Z_L$ of the impedance converter 15 becomes larger than a value twice the impedance value $Z_0$ of the output load.

As described above, according to the conventional method in which the device size of the carrier amplifier is set different from that of the peak amplifier, the impedance of the impedance converter tends to increase. In addition, the efficiency of the Doherty amplifier is degraded as the impedance of the impedance converter increases.

[a] First Embodiment

Figure 2:
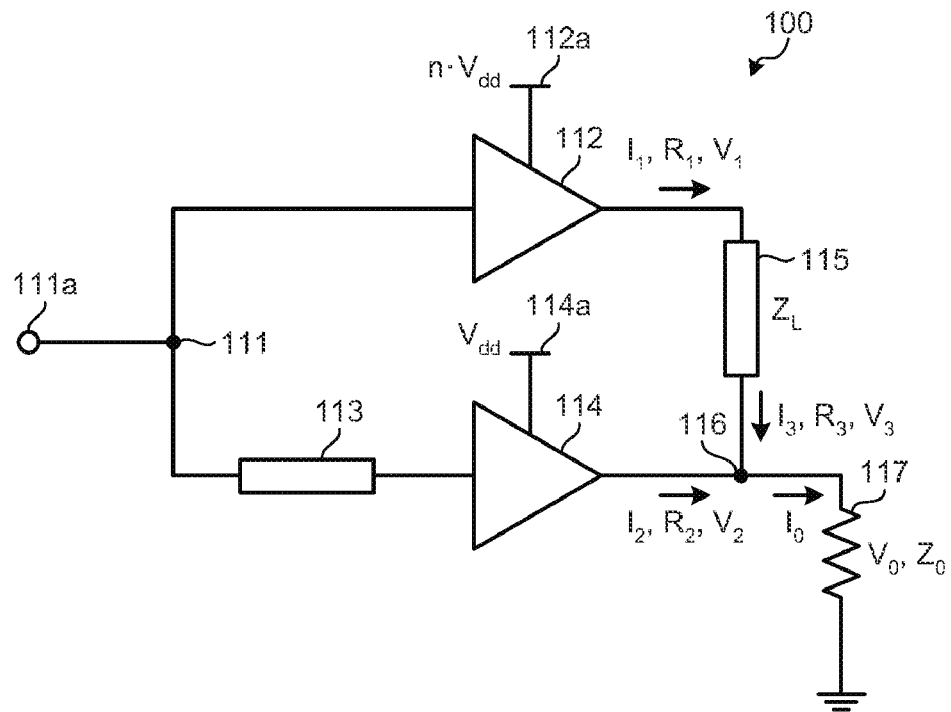
FIG. 2 is a block diagram of a configuration example of a Doherty amplifier according to a first embodiment of the present invention.

A configuration of a Doherty amplifier 100 according to a first embodiment of the present invention is explained next. FIG. 2 is a block diagram of a configuration example of the Doherty amplifier according to the first embodiment. As depicted in FIG. 2, the Doherty amplifier 100 according to the first embodiment includes a distributor 111, a carrier amplifier 112, a phase regulator 113, a peak amplifier 114, an impedance converter 115, a synthesizer 116, and an output load 117. The distributor 111 branches an RF signal input from an input terminal 111a into two RF signals, and distributes one of the RF signals to the carrier amplifier 112, and the other RF signal to the phase regulator 113.

The carrier amplifier 112 includes a field effect transistor (FET) as an amplifying element. The carrier amplifier 112 amplifies an RF signal input from the distributor 111 according to a voltage applied to a supply terminal 112a, and outputs the amplified RF signal to the impedance converter 115. The supply terminal 112a of the carrier amplifier 112 is coupled to a DC power supply, and is also coupled to the FET in the carrier amplifier 112. The voltage applied to the supply terminal 112a of the carrier amplifier 112 is also referred to as "drain voltage". The voltage applied to the supply terminal 112a of the carrier amplifier 112 is set to be different from a voltage applied to a supply terminal 114a of the peak amplifier 114. In the first embodiment, the voltage applied to the supply terminal 112a of the carrier amplifier 112 is set to be n times the voltage Vdd applied to the supply terminal 114a of the peak amplifier 114.

The phase regulator 113 regulates the phase of the RF signal input from the distributor 111, and outputs the phase-regulated RF signal to the peak amplifier 114.

The peak amplifier 114 includes an FET as an amplifying element similarly to the carrier amplifier 112. The peak amplifier 114 amplifies the RF signal input from the distributor 111 according to the voltage applied to the supply terminal 114a when the power of the RF signal exceeds a threshold, and outputs the amplified RF signal to the synthesizer 116. The supply terminal 114a of the peak amplifier 114 is coupled to the DC power supply, and is also coupled to the FET in the peak amplifier 114. The voltage applied to the supply terminal 114a of the peak amplifier 114 is also referred to as "drain voltage".

The impedance converter 115 is a transmission line having an electrical length of λ/4, and is coupled to an output terminal of the carrier amplifier 112.

The synthesizer 116 is coupled to an output terminal of the impedance converter 115 and an output terminal of the peak amplifier 114, and synthesizes the RF signal from the impedance converter 115 and the RF signal from the peak amplifier 114. The output load 117 is coupled to an output terminal of the synthesizer 116. The impedance value $Z_0$ of the output load 117 is fixed.

In the Doherty amplifier 100 according to the first embodiment, the carrier amplifier 112 operates in the Class AB or Class B, and the peak amplifier 114 operates in the Class B or Class C. That is, only the carrier amplifier 112 operates as a first amplifier until the carrier amplifier 112 becomes saturated, and when the carrier amplifier 112 becomes saturated, the peak amplifier 114 operates as a second amplifier.

Particularly, in the Doherty amplifier 100 according to the first embodiment, the voltage applied to the supply terminal 112a of the carrier amplifier 112 is set to be lower than the voltage applied to the supply terminal 114a of the peak amplifier 114. With this setting, the impedance value of the impedance converter 115 is set to be smaller than a value twice the impedance value of the output load 117. Accordingly, it is possible to avoid a state that the impedance value of the impedance converter 115 increases inadvertently, and degradation of efficiency caused by an increase in the impedance value of the impedance converter 115 can be avoided.

The reason why the Doherty amplifier 100 according to the first embodiment can avoid degradation of efficiency caused by an increase in the impedance value of the impedance converter 115 is as follows.

First, the ratio α is defined by the following equation (8) similarly to the equation (1).

$$\alpha = I_3/I_0 \quad (8)$$

where $I_3$ is a current output from the impedance converter 115 to the synthesizer 116, and $I_0$ is a current output from the synthesizer 116 to the output load 117.

In the output load 117, the following equation (9) is established.

$$V_0 = I_0 \cdot Z_0 \quad (9)$$

where $V_0$ is a voltage of the output load 117, and $Z_0$ is an impedance value of the output load 117.

The following equation (10) is obtained from the equation (8) and the equation (9).

$$I_3 = \alpha \cdot V_0/Z_0 \quad (10)$$

The following equation (11) is obtained from the equation (10) and the relation of $V_0 = V_3$.

$$R_3 = V_3/I_3 = V_0/(V_0/Z_0 \cdot \alpha) = 1/\alpha \cdot Z_0 \quad (11)$$

where $R_3$ is an impedance at the output terminal of the impedance converter 115.

Because the power at the input terminal and the power at the output terminal of the impedance converter 115 are the same, the following equation (12) is established.

$$V_1^2/R_1 = I_3 \cdot V_3 \quad (12)$$

The following equation (13) is obtained from the characteristics of the impedance converter 115.

$$R_1 \cdot R_3 = Z_L^2 \quad (13)$$

The following equation (14) is obtained by applying the equation (11) to the equation (13).

$$Z_L^2 = R_1 \cdot (1/\alpha) \cdot Z_0 \quad (14)$$

The following equation (15) is obtained by applying the equation (12) to the equation (14).

$$Z_L^2 = V_1^2/(I_3 \cdot V_3) \cdot (1/\alpha) \cdot Z_0 \quad (15)$$

The following equation (16) is obtained by applying the equation (10) and the relation of $V_3 = V_0$ to the equation (15).

$$Z_L^2 = (1/\alpha^2) \cdot Z_0^2 \cdot V_1^2/V_0^2 \quad (16)$$

The following equation (17) is obtained from the equation (16).

$$Z_L = (1/\alpha) \cdot Z_0 \cdot V_1/V_0 \quad (17)$$

When it is assumed that the voltage $V_1$ at the output terminal of the carrier amplifier 112 is proportional to a voltage n·Vdd applied to the supply terminal 112a, the following equation (18) is established.

$$V_1 = x \cdot n \cdot Vdd \quad (18)$$

where x is a proportional constant.

Further, when it is assumed that a voltage at the output terminal of the peak amplifier 114 is proportional to the voltage Vdd applied to the supply terminal 114a, the following equation (19) is established.

$$V_2 = x \cdot Vdd \quad (19)$$

The following equation (20) is obtained from the equation (18) and the equation (19).

$$V_1 = n \cdot V_2 = n \cdot V_0 \quad (20)$$

The following equation (21) is obtained by applying the equation (20) to the equation (17).

$$Z_L = (1/\alpha) \cdot n \cdot Z_0 \quad (21)$$

In the first embodiment, because the impedance value $Z_L$ of the impedance converter 115 is set to be smaller than a value twice the impedance value $Z_0$ of the output load 117, the following equation (22) is established.

$$Z_L < 2Z_0 \quad (22)$$

The following equation (23) is obtained from the equation (21) and the equation (22).

$$n < 2 \cdot \alpha \quad (23)$$

The following equation (24) is obtained from the equation (23) when α<0.5.

$$n < 1 \quad (24)$$

The equation (24) means that when the voltage n·Vdd applied to the supply terminal 112a of the carrier amplifier 112 is set to be lower than the voltage Vdd applied to the supply terminal 114a of the peak amplifier 114, degradation of efficiency can be avoided.

As described above, in the first embodiment, the voltage applied to the supply terminal 112a of the carrier amplifier 112 is set to be lower than the voltage applied to the supply terminal 114a of the peak amplifier 114. Further, the impedance value of the impedance converter 115 is set to be smaller than a value twice the impedance value of the output load 117. Accordingly, it is possible to avoid a state that the impedance value of the impedance converter 115 increases inadvertently, and degradation of efficiency caused by an increase in the impedance value of the impedance converter 115 can be avoided.

In the first embodiment, a parameter defining a physical size of the carrier amplifier 112 and a parameter defining a physical size of the peak amplifier 114 are the same. The carrier amplifier 112 and the peak amplifier 114 according to the first embodiment include the FET as the amplifying element. Therefore, the gate width, the gate length, the number of gates, or the number of FETs in a package of the carrier amplifier 112 is the same as that of the peak amplifier 114. In other words, the device size of the carrier amplifier 112 and the device size of the peak amplifier 114 are the same. In the first embodiment, even if the device size of the carrier amplifier 112 and the device size of the peak amplifier 114 are the same, it is possible to avoid a state that the impedance value of the impedance converter 115 increases inadvertently.

The reason why the Doherty amplifier 100 according to the first embodiment can avoid a state that the impedance value of the impedance converter 115 increases inadvertently, even if the device size of the carrier amplifier 112 and that of the peak amplifier 114 are the same is as follows.

First, the power of the carrier amplifier 112 is obtained. Power $I_1 \cdot V_1$ of the carrier amplifier 112 is obtained by using the following equation (25).

$$I_1 \cdot V_1 = I_3 \cdot V_3 \quad (25)$$

The following equation (26) is obtained by applying the equation (10) and the relation of $V_3 = V_0$ to the equation (25).

$$I_1 \cdot V_1 = (V_0^2/Z_0) \cdot \alpha \quad (26)$$

Next, the power of the peak amplifier 114 is obtained. Power $I_2 \cdot V_2$ of the peak amplifier 114 is obtained by using the following equation (27).

$$I_2 \cdot V_2 = I_2 \cdot V_0 \quad (27)$$

The following equation (28) is established regarding $I_2$.

$$I_2 = I_0 - I_3 \quad (28)$$

The following equation (29) is obtained by applying the equation (8) to the equation (28).

$$I_2 = (1-\alpha) \cdot I_0 \quad (29)$$

$I_0$ is obtained by using the following equation (30).

$$I_0 = V_0/Z_0 \quad (30)$$

The following equation (31) is obtained from the equation (29) and the equation (30).

$$I_2 = V_0/Z_0 \cdot (1-\alpha) \quad (31)$$

The following equation (32) is obtained by applying the equation (31) to the equation (27).

$$I_2 \cdot V_2 = V_0^2/Z_0 \cdot (1-\alpha) \quad (32)$$

When a ratio between the power of the carrier amplifier 112 and the power of the peak amplifier 114 is obtained from the equation (26) and the equation (32), the following equation (33) is derived.

$$I_1 \cdot V_1/(I_2 \cdot V_2) = \alpha/(1-\alpha) \quad (33)$$

In the first embodiment, the gate width, the gate length, the number of gates, or the number of FETs in the package of the carrier amplifier 112 is the same as that of the peak amplifier 114. Therefore, the saturated power in the carrier amplifier 112 and that in the peak amplifier 114 are respectively proportional to the voltage n·Vdd applied to the supply terminal 112a and the voltage Vdd applied to the supply terminal 114a. That is, the following equation (34) is established.

$$I_1 \cdot V_1/(I_2 \cdot V_2) = n \cdot Vdd/Vdd = n \quad (34)$$

The following equation (35) is obtained from the equation (33) and the equation (34).

$$\alpha/(1-\alpha) = n \quad (35)$$

The following equation (36) is obtained by applying the equation (35) to the equation (21).

$$Z_L = (1+n) \cdot Z_0 \quad (36)$$

The following equation (37) is obtained from the equation (36) and the equation (22).

$$n < 1 \quad (37)$$

The equation (37) indicates that even if the parameter defining the physical size of the supply terminal 112a and the parameter defining the physical size of the supply terminal 114a are the same, an increase in the impedance value of the impedance converter 115 can be suppressed by setting the voltage n·Vdd applied to the supply terminal 112a of the carrier amplifier 112 to be lower than the voltage Vdd applied to the supply terminal 114a of the peak amplifier 114.

In the first embodiment, a case where the carrier amplifier 112 and the peak amplifier 114 include an FET as their amplifying element has been explained. However, the carrier amplifier 112 and the peak amplifier 114 can include a bipolar transistor instead of the FET. In the case of including a bipolar transistor, the emitter area or the number of bipolar transistors in a package of the carrier amplifier 112 becomes the same as that of the peak amplifier 114. In this case, the voltage applied to the supply terminal 112a of the carrier amplifier 112 and the voltage applied to the supply terminal 114a of the peak amplifier 114 are coupled to a collector terminal of the bipolar transistor. These voltages are also referred to as "collector voltage".

As described above, in the Doherty amplifier 100 according to the first embodiment, the voltage applied to the supply terminal 112a of the carrier amplifier 112 is set to be lower than the voltage applied to the supply terminal 114a of the peak amplifier 114. Furthermore, the impedance value of the impedance converter 115 is set to be smaller than a value twice the impedance value of the output load 117. Therefore, according to the first embodiment, it is possible to avoid a state that the impedance value of the impedance converter 115 increases inadvertently, and degradation of efficiency caused by an increase in the impedance value of the impedance converter 115 can be avoided.

Furthermore, in the Doherty amplifier 100 according to the first embodiment, the parameter defining the physical size of the carrier amplifier 112 and the parameter defining the physical size of the peak amplifier 114 are the same. Therefore, according to the first embodiment, even if the parameter defining the physical size of the carrier amplifier 112 and the parameter defining the physical size of the peak amplifier 114 are the same, an increase in the impedance value of the impedance converter 115 can be suppressed by setting the voltage n·Vdd applied to the supply terminal 112a of the carrier amplifier 112 to be lower than the voltage Vdd applied to the supply terminal 114a of the peak amplifier 114. As a result, degradation of efficiency caused by an increase in the impedance value of the impedance converter 115 can be avoided more efficiently.

[b] Second Embodiment

The first embodiment has explained a case where the parameter defining the physical size of the carrier amplifier 112 and the parameter defining the physical size of the peak amplifier 114 are the same. Meanwhile, the parameter defining the physical size of the carrier amplifier 112 and the parameter defining the physical size of the peak amplifier 114 may be different from each other. Such a case is explained below as a second embodiment of the present invention.

In a Doherty amplifier according to the second embodiment, the voltage applied to the supply terminal 112a of the carrier amplifier 112 is set to be n times the voltage applied to the supply terminal 114a of the peak amplifier 114. With this setting, the impedance value of the impedance converter 115 is set to be smaller than a value twice the impedance Value of the output load 117.

Furthermore, differently from the Doherty amplifier 100 according to the first embodiment, in the Doherty amplifier according to the second embodiment, the parameter defining the physical size of the carrier amplifier 112 is different from the parameter defining the physical size of the peak amplifier 114.

Specifically, the parameter defining the physical size of the carrier amplifier 112 is m times the parameter defining the physical size of the peak amplifier 114. For example, the gate width, the number of gates, or the number of FETs in a package of the carrier amplifier 112 is m times that of the peak amplifier 114. Furthermore, when the parameter defining the physical size is the gate length, the gate length of the carrier amplifier 112 is 1/m times the gate length of the peak amplifier 114. Therefore, the saturated power in the carrier amplifier 112 and that in the peak amplifier 114 are respectively proportional to a voltage n·m·Vdd applied to the supply terminal 112a and the voltage Vdd applied to the supply terminal 114a. That is, the following equation (38) is established.

$$I_1 \cdot V_1 / (I_2 \cdot V_2) = n \cdot m \cdot Vdd / Vdd = n \cdot m \quad (38)$$

The following equation (39) is obtained from the equation (33) and the equation (38).

$$\alpha/(1-\alpha) = n \cdot m \quad (39)$$

The following equation (40) is obtained by applying the equation (39) to the equation (21).

$$Z_L = (1 + n \cdot m)/m \cdot Z_0 \quad (40)$$

The following equation (41) is obtained from the equation (40) and the equation (22).

$$(1 + n \cdot m)/m < 2 \quad (41)$$

The equation (41) indicates that the impedance value of the impedance converter 115 can be set to be smaller than a value twice the impedance value of the output load 117, when the parameter defining the physical size of the carrier amplifier 112 is different from the parameter defining the physical size of the peak amplifier 114, thereby suppressing an increase in the impedance value of the impedance converter 115.

As described above, in the Doherty amplifier 100 according to the second embodiment, the parameter defining the physical size of the carrier amplifier 112 is different from the parameter defining the physical size of the peak amplifier 114. Therefore, according to the second embodiment, because the impedance value of the impedance converter 115 can be set to be smaller than a value twice the impedance value of the output load 117, an increase in the impedance value of the impedance converter 115 can be suppressed and degradation of efficiency caused by an increase in the impedance value of the impedance converter 115 can be avoided more efficiently.

According to an aspect of the Doherty amplifier according to the present invention, degradation of efficiency caused by an increase in the impedance of the impedance converter can be avoided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A Doherty amplifier comprising:
   a first amplifier that amplifies an RF input signal according to a voltage applied to a supply terminal thereof;
   a second amplifier that amplifies a peak component of the RF input signal according to a voltage applied to a supply terminal thereof;
   a transmission line coupled to an output terminal of the first amplifier;
   a synthesizer that is coupled to an output terminal of the transmission line and an output terminal of the second amplifier, and synthesizes an output signal of the transmission line and an output signal of the second amplifier; and
   an output load coupled to an output terminal of the synthesizer, wherein
   it is set such that the voltage applied to the supply terminal of the first amplifier is lower than the voltage applied to the supply terminal of the second amplifier, and that an impedance value of the transmission line is smaller than a value twice an impedance value of the output load.

2. The Doherty amplifier according to claim 1, wherein a parameter defining a physical size of the first amplifier and a parameter defining a physical size of the second amplifier are same.

3. The Doherty amplifier according to claim 1, wherein when a parameter defining a physical size of the first amplifier is m times a parameter defining a physical size of the second amplifier, and the voltage applied to the supply terminal of the first amplifier is n times the voltage applied to the supply terminal of the second amplifier, m and n are set such that a relation of (1+m·n)<2 is established.

* * * * *